(12) United States Patent
Hu

(10) Patent No.: US 9,735,079 B2
(45) Date of Patent: Aug. 15, 2017

(54) MOLDING COMPOUND WRAPPED PACKAGE SUBSTRATE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 14/878,302

(22) Filed: Oct. 8, 2015

(65) Prior Publication Data

US 2017/0103943 A1 Apr. 13, 2017

(51) Int. Cl.
| | | |
|---|---|---|
| *H01L 23/31* | (2006.01) | |
| *H01L 23/498* | (2006.01) | |
| *H01L 25/065* | (2006.01) | |
| *H01L 23/00* | (2006.01) | |
| *H01L 23/14* | (2006.01) | |

(52) U.S. Cl.
CPC ........ *H01L 23/3157* (2013.01); *H01L 23/145* (2013.01); *H01L 23/31* (2013.01); *H01L 23/49816* (2013.01); *H01L 23/49822* (2013.01); *H01L 23/49827* (2013.01); *H01L 23/49838* (2013.01); *H01L 24/17* (2013.01); *H01L 25/0655* (2013.01); *H01L 2224/16227* (2013.01)

(58) Field of Classification Search
CPC ....... H01L 23/12; H01L 23/13; H01L 23/145; H01L 23/147; H01L 23/15; H01L 23/28; H01L 23/293; H01L 23/31; H01L 23/3157; H01L 23/49811; H01L 23/49816; H01L 23/49827; H01L 23/538; H01L 23/5383; H01L 23/5386
See application file for complete search history.

(56) References Cited

U.S. PATENT DOCUMENTS

| | | | | |
|---|---|---|---|---|
| 9,013,041 | B2* | 4/2015 | Karikalan | H01L 23/538 257/741 |
| 9,478,474 | B2* | 10/2016 | Chen | H01L 23/3128 |
| 2009/0145636 | A1* | 6/2009 | Miki | H01L 21/6835 174/255 |
| 2011/0063806 | A1* | 3/2011 | Kariya | H01L 21/4857 361/748 |
| 2012/0146209 | A1 | 6/2012 | Hu et al. | |
| 2014/0131856 | A1* | 5/2014 | Do | H01L 21/563 257/737 |
| 2015/0235915 | A1* | 8/2015 | Liang | H01L 23/145 361/764 |
| 2016/0300817 | A1* | 10/2016 | Do | H01L 21/56 |

* cited by examiner

*Primary Examiner* — Eduardo A Rodela
(74) *Attorney, Agent, or Firm* — Jianq Chyun IP Office

(57) ABSTRACT

A package substrate for chip/chips package wrapped by a molding compound is disclosed. The molding compound functions as a stiffener for the thin film package substrate. One embodiment discloses at least one redistribution layer (RDL) is prepared and the RDL is wrapped by a molding compound. The molding compound wraps four lateral sides and bottom side of the RDL. A top side of the RDL is made for a chip to mount and a bottom side of the RDL is planted a plurality of solder balls so that the bottom side of the chip package is adaptive to mount onto a system board in a later process.

19 Claims, 10 Drawing Sheets

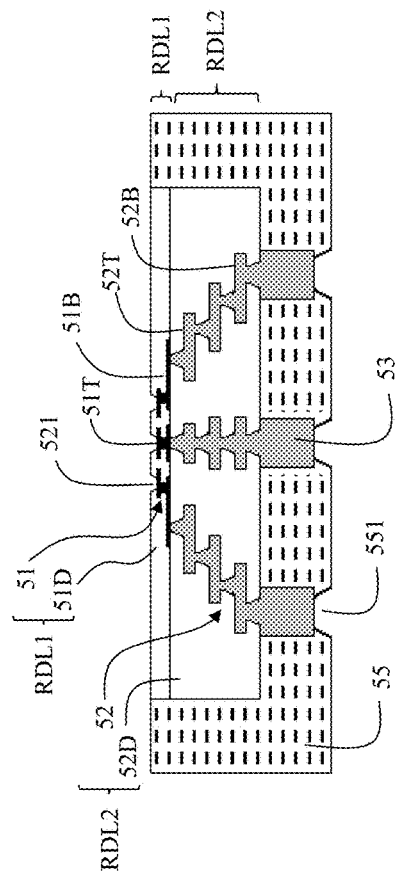
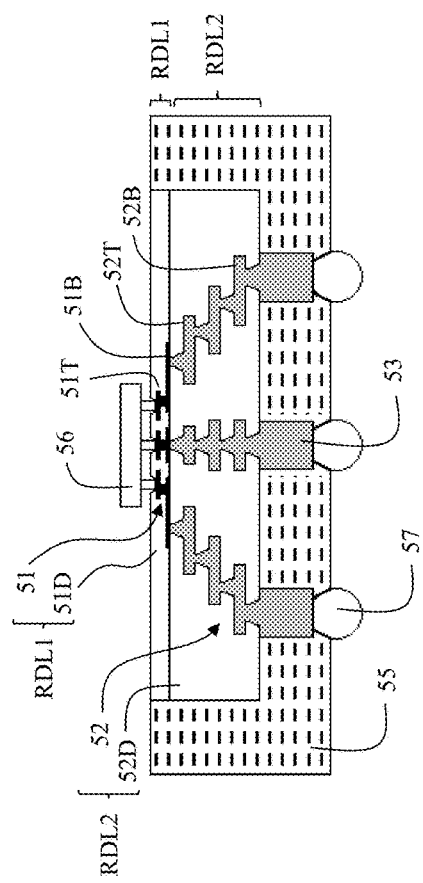
Fig.7A
Fig.7B

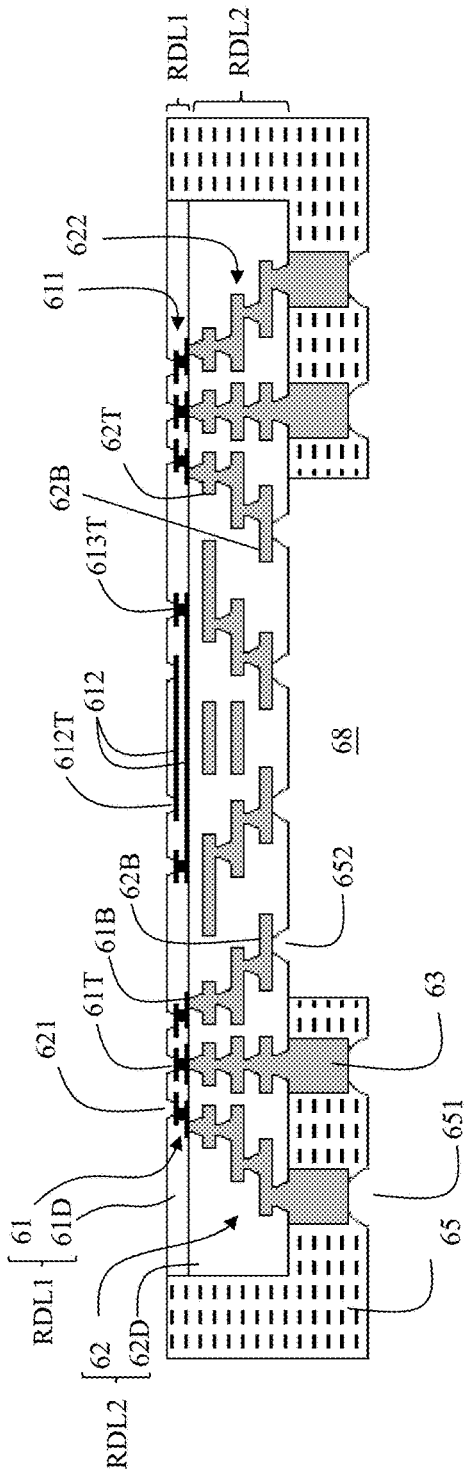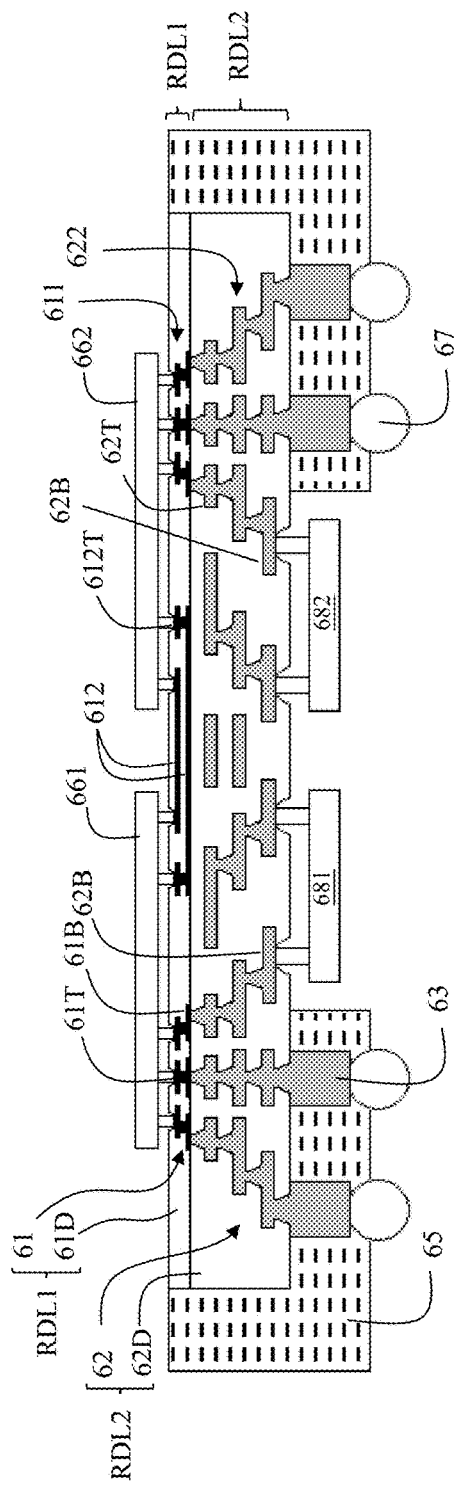

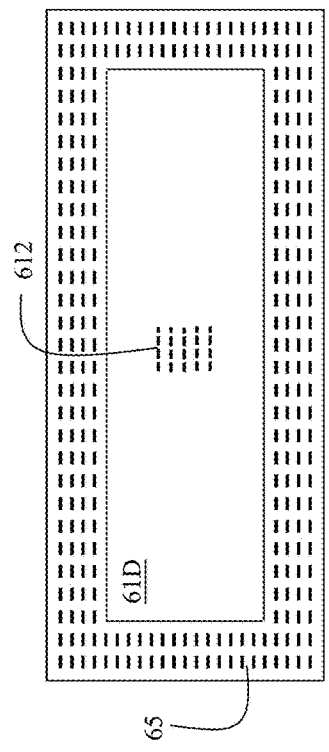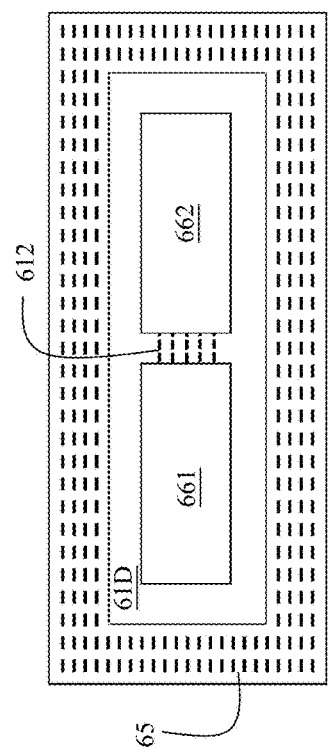

MOLDING COMPOUND WRAPPED PACKAGE SUBSTRATE

BACKGROUND

Technical Field

The present invention relates to a package substrate for chip/chips package, especially relates to a package substrate having molding compound wrapped four lateral sides and bottom side to stiffen the high density package substrate.

Description of Related Art

FIG. 1 Shows a Prior Art.

FIG. 1 shows a prior art package substrate for chip package. US20120146209A1 disclosed a chip package which has a through-holed interposer 21, a redistribution-layer 213 disposed on a top side of the interposer 21. A molding layer 22 is formed to embed the through-holed interposer 21. The molding layer 22 has an exposed first surface 22a and a second surface 22b. A built-up structure 24 is formed on the second surface 22b of the molding layer 22. The built-up structure 24 comprises a dielectric layer 240 and a wiring layer 241, such that the conductive vias 242 are formed in the dielectric layer 240 for electrically connecting the wiring layer 241 to the conductive through metal 210. A solder mask layer 25 is formed on the outermost dielectric layer 240 to expose conductive pads 243. The through-holed interposer 21 is made of glass or ceramic such as Al2O3 and AlN, wherein the ceramic has a CTE of about 3 ppm/° C. that is close to silicon. A chip 27 is flip-chip electrically connected to the electrode pads 211 of the redistribution-layer 213 through a plurality of solder bumps 271, an underfill 270 is used to fill the space between the electrode pads 211 and the chip 27, and a plurality of solder balls 26 are mounted on the conductive pads 243 for the package to electrically coupled to an outside print circuit board (not shown).

The prior art package substrate is mainly stiffened by the glass/ceramic interposer 21. However, semiconductor package technology moves faster and faster, a thinner thickness package substrate without having a glass/ceramic interposer is developed, a different stiffening structure has to be conceived for a high density package substrate used for chip or chips package.

BRIEF DESCRIPTION OF THE DRAWINGS

FIGS. 7A~7B show a sixth embodiment according to the present invention.

FIGS. 9A~9B show an eighth embodiment according to the present invention.

FIGS. 10A~10B show a top view of FIGS. 9A~9B.

DETAILED DESCRIPTION OF THE INVENTION

A molding compound wrapped thin film high package substrate is disclosed. The package substrate has a top side for chip mount and a bottom side for mounting the chip package onto a system board. The molding compound wrapped the package substrate at least four lateral side and a bottom side to stiffen the thin film package substrate.

Figure 1:
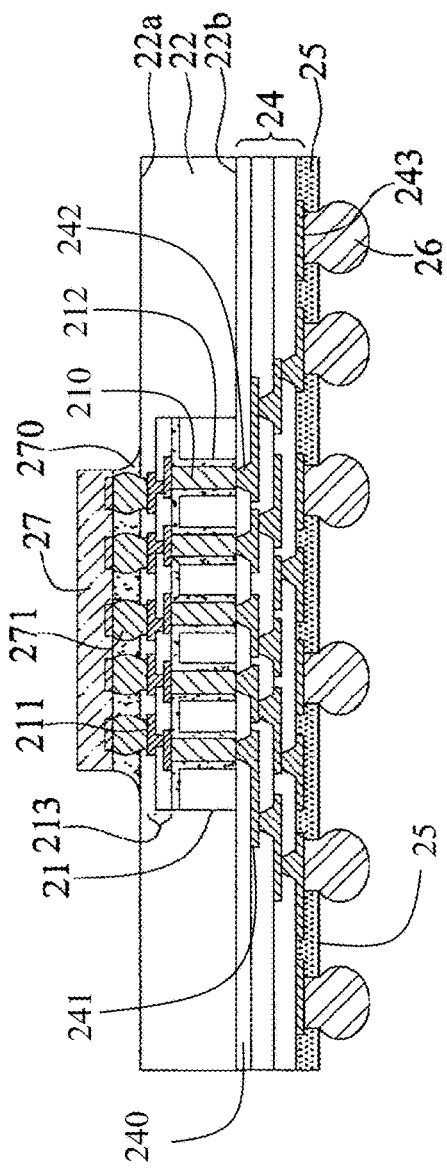
FIG. 1 shows a prior art.
Figure 2A:
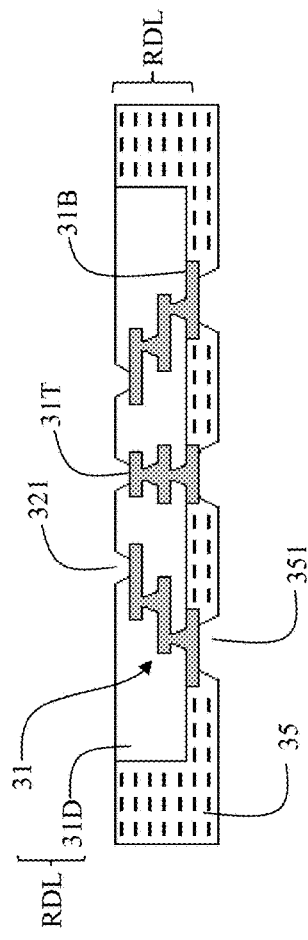
FIGS. 2A~2B show a first embodiment according to the present invention.
Figure 2B:
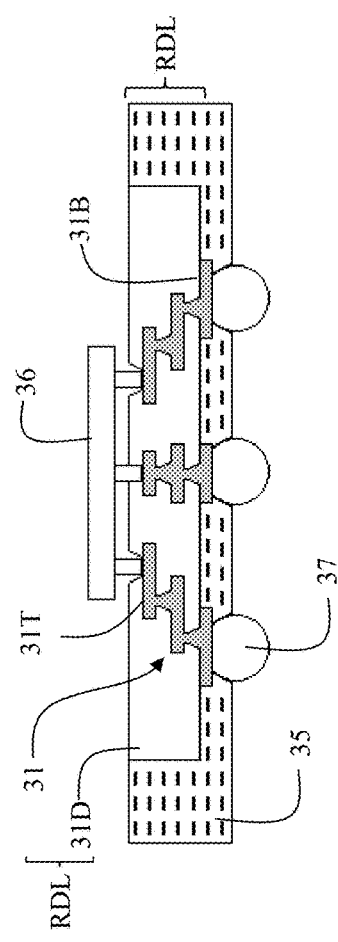

FIGS. 2A~2B Show a First Embodiment According to the Present Invention.

FIG. 2A shows a first package substrate according to the present invention.

FIG. 2A shows a redistribution layer (RDL) which has a redistribution circuitry 31 embedded in a dielectric layer 31D; the redistribution circuitry 31 has a plurality of top metal pads 31T and a plurality of bottom metal pads 31B; the redistribution circuitry 31 fans out downwards so that a density of the bottom metal pads 31B is lower than a density of the top metal pads 31T. A plurality of top openings 321 are formed on a top side of the dielectric layer 31D; each top opening 321 exposes a top surface of a corresponding top metal pad 31T. A molding compound 35 wraps four lateral sides and bottom side of the dielectric layer 31D; and a plurality of bottom openings 351 are formed on a bottom side of the molding compound 35; each opening 351 exposes a bottom side of a corresponding bottom metal pad 31B.

FIG. 2B shows a chip package using the package substrate of FIG. 2A.

FIG. 2B shows at least one chip 36 is exemplarily configured on a top side of the redistribution circuitry 31 and electrically coupled to the top metal pads 31T of the redistribution circuitry 31. A plurality of solder balls 37 are configured on a bottom side of the redistribution circuitry 31, each solder ball 37 is configured on a bottom side of a corresponding bottom metal pad 31B.

Figure 3A:
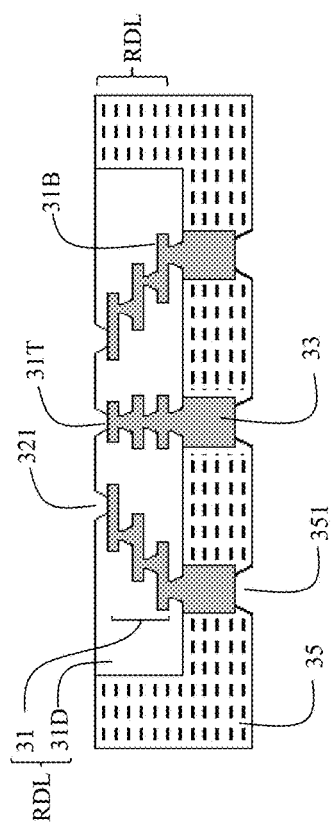
FIGS. 3A~3B show a second embodiment according to the present invention.
Figure 3B:
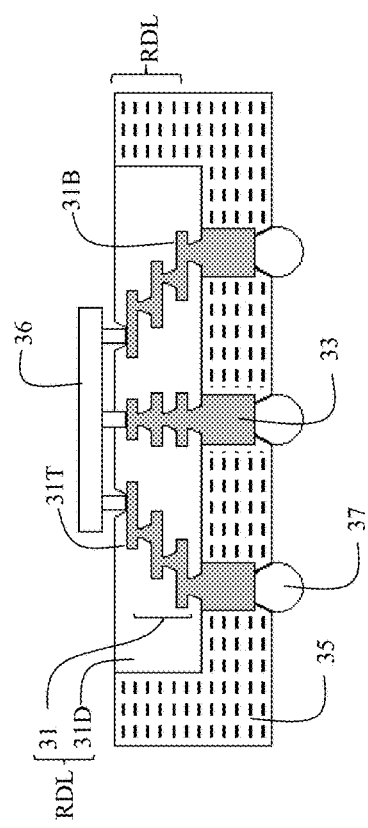

FIGS. 3A~3B Show a Second Embodiment According to the Present Invention.

FIG. 3A shows a modified structure of FIG. 2A.

FIG. 3A is similar to FIG. 2A. However, FIG. 3A has a plurality of metal pillars 33 formed on a bottom side of the redistribution circuitry 31. FIG. 3A shows a redistribution layer (RDL) which has a redistribution circuitry 31 embedded in a dielectric layer 31D; wherein the redistribution circuitry 31 has a plurality of top metal pads 31T and a plurality of bottom metal pads 31B; the redistribution circuitry 31 fans out downwards so that a density of the bottom metal pads 31B is lower than a density of the top metal pads 31T. A plurality of metal pillars 33 are formed on a bottom side of the redistribution circuitry 31, each metal pillar 33 is configured on a bottom side of a corresponding bottom metal pad 31B. A plurality of top openings 321 are formed on a top side of the dielectric layer 31D; each top opening 321 exposes a top surface of a corresponding top metal pad 31T. A molding compound 35 wraps four lateral sides and bottom side of the dielectric layer 31D; and a plurality of bottom openings 351 are formed on a bottom side of the molding compound 35; each opening 351 exposes a bottom side of a corresponding bottom metal pad 31B.

FIG. 3B shows a chip package using the package substrate of FIG. 3A.

FIG. 3B shows at least one chip 36 is exemplarily configured on a top side of the redistribution circuitry 31 and electrically coupled to the top metal pads 31T of the redistribution circuitry 31. A plurality of solder balls 37 are configured on a bottom side of the redistribution circuitry 31, each solder ball 37 is configured on a bottom side of a corresponding metal pillar 33.

Figure 4A:
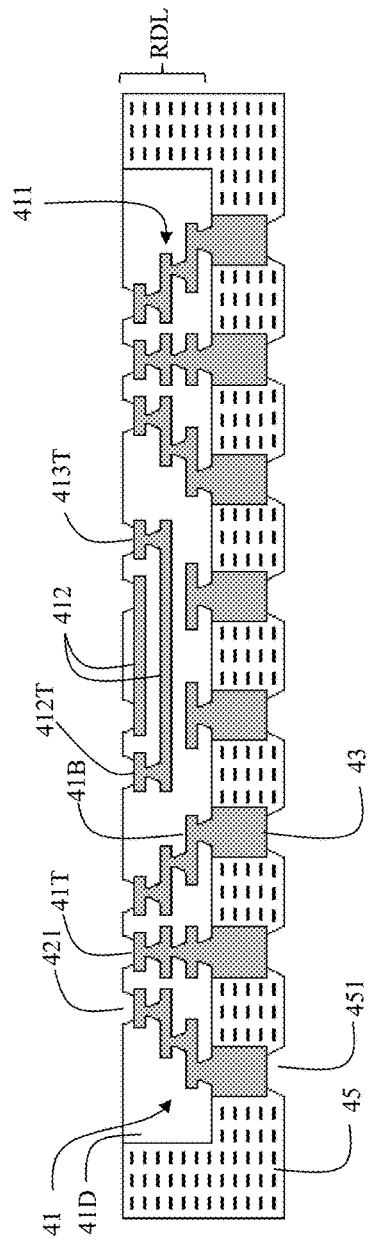
FIGS. 4A~4B show a third embodiment according to the present invention.
Figure 4B:
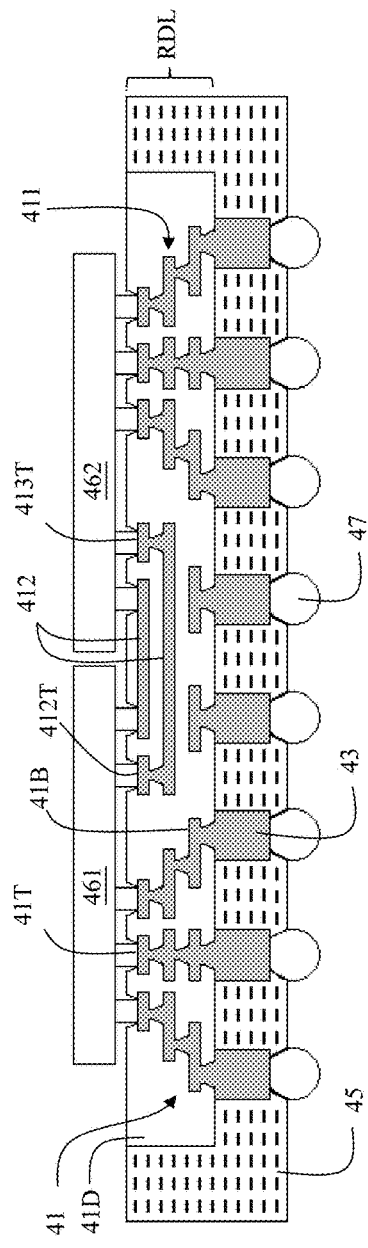

FIGS. 4A~4B Show a Third Embodiment According to the Present Invention.

FIG. 4A shows a modified structure of FIG. 3A. FIG. 4A shows a package substrate which has a redistribution layer RDL. The RDL comprises a left redistribution circuitry 41 and a right redistribution circuitry 411, both redistribution circuitry 41, 411 are embedded in a dielectric layer 41D. The left redistribution circuitry 41 has a plurality of top metal pads 41T and a plurality bottom metal pads 41B; the left redistribution circuitry 41 fans out downwards so that a density of the bottom metal pads 41B is lower that a density of the top metal pads 41T. The right redistribution circuitry 411 is similar to the first redistribution circuitry 41. The right redistribution circuitry 411 has a plurality of top metal pads and a plurality of bottom metal pads; the right redistribution circuitry 411 fans out downwards so that a density of the bottom metal pads is lower that a density of the top metal pads. A plurality of top openings 421 are formed on a top side of the dielectric layer 41D; each top opening 421 exposes a top surface of a corresponding top metal pad 41T. A plurality of metal pillars 43 are formed on a bottom side of the redistribution circuitry 41, each metal pillar 43 is configured on a bottom side of a corresponding bottom metal pad 41B. A molding compound 45 wraps four lateral sides and bottom side of the dielectric layer 41D; the molding compound 45 also wraps the plurality of metal pillars 43; and a plurality of bottom openings 451 are formed on a bottom side of the molding compound 45; each opening 451 exposes a bottom side of a corresponding metal pillar 43. A lateral communication circuitry 412 is configured between the left redistribution circuitry 41 and the right redistribution circuitry 411; the lateral communication circuitry 412 has a plurality of left top metal pads 412T and a plurality of right top metal pads 413T exposed on a top side of the dielectric layer 41D.

FIG. 4B shows a chip package using the package substrate of FIG. 4A.

FIG. 4B shows at least one left chip 461 is exemplarily configured on a top side the left redistribution circuitry 41 and electrically coupled to the top metal pads 41T of the left redistribution circuitry 41; and at least one right chip 462 is exemplarily configured on a top side of the right redistribution circuitry 411 and electrically coupled to the top metal pad 41T of the right redistribution circuitry 411. A plurality of solder balls 47 are configured on a bottom side of the redistribution circuitry 41, 411, each solder ball 47 is configured on a bottom side of a corresponding metal pillar 43. The lateral communication circuitry 412 communicates the first chip 461 and the second chip 462.

Figure 5A:
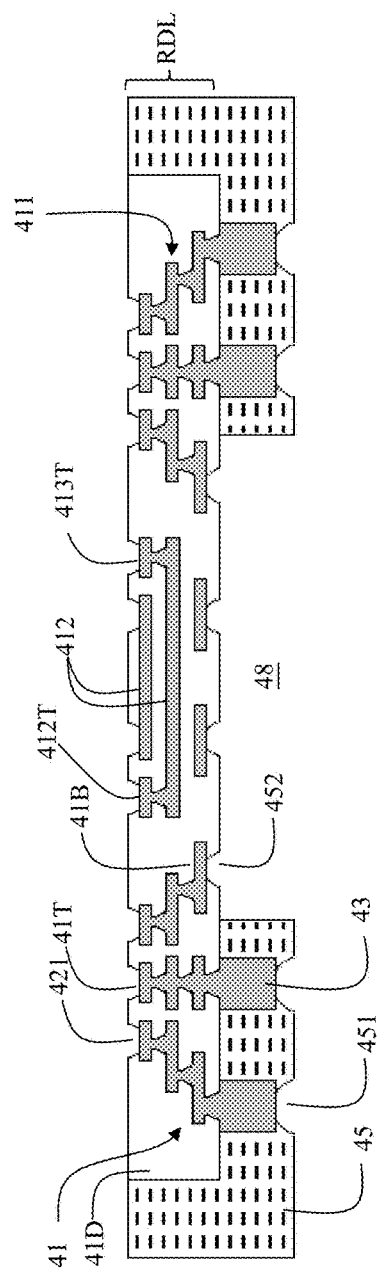
FIGS. 5A~5B show a fourth embodiment according to the present invention.
Figure 5B:
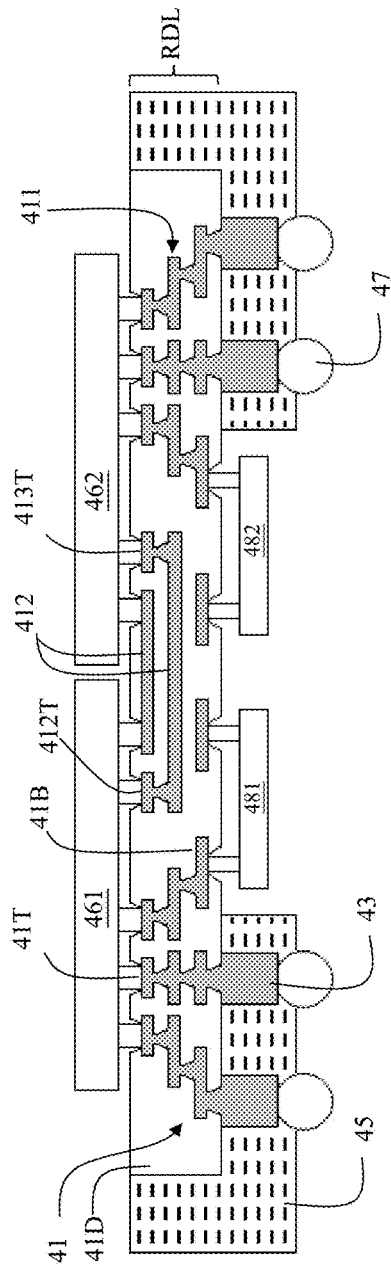

FIGS. 5A~5B Show a Fourth Embodiment According to the Present Invention.

FIG. 5A shows a modified structure of FIG. 4A.

FIG. 5A shows a cavity 48 is formed on a bottom side of the dielectric layer 41D, and enclosed by the molding compound 45; and a plurality of openings 452 are formed on a bottom side of the dielectric layer 41D within the cavity 48, each opening 452 exposes a bottom side of a corresponding bottom metal pad 41B within the cavity 48.

FIG. 5B shows a chip package using the package substrate of FIG. 5A.

FIG. 5B shows two chips 481, 482 are exemplarily shown to be electrically coupled to the bottom metal pads 41B within the cavity 48. A plurality of solder balls 47 are configured on a bottom side of the redistribution circuitry 41, 411, each solder ball 47 is configured on a bottom side of a corresponding metal pillar 43.

Figure 6A:
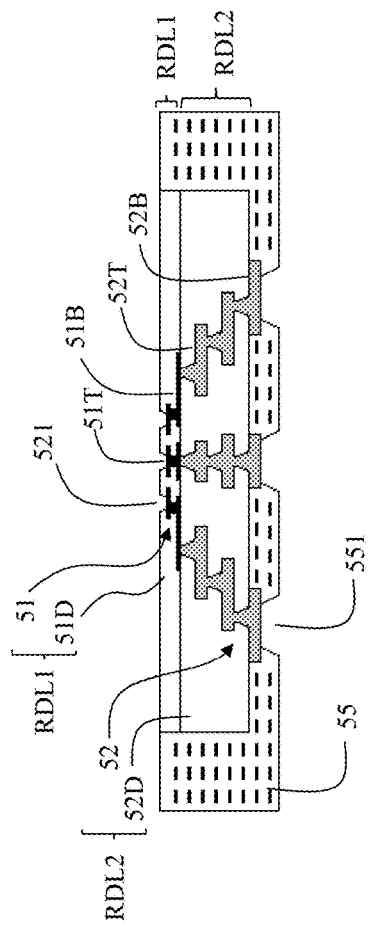
FIGS. 6A~6B show a fifth embodiment according to the present invention.
Figure 6B:
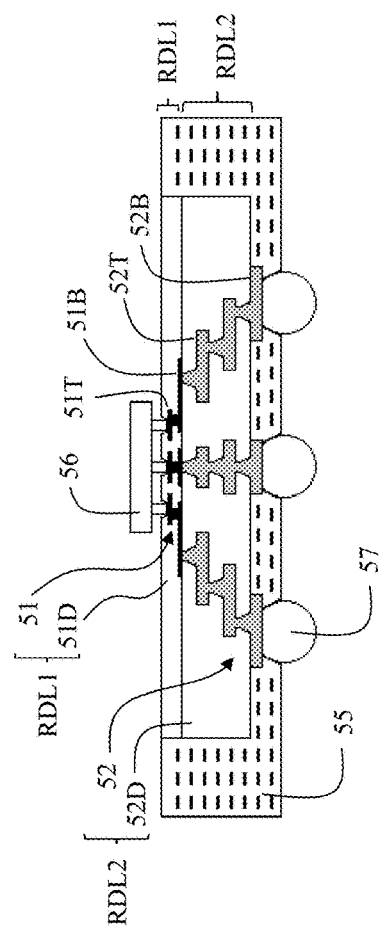

FIGS. 6A~6B Show a Fifth Embodiment According to the Present Invention.

FIG. 6A shows a package substrate according to the presentation invention.

FIG. 6A shows a package substrate which has a first redistribution layer RDL1. The RDL1 is built according to a first design rule. The RDL1 has a first redistribution circuitry 51 embedded in a first dielectric layer 51D; the first redistribution circuitry 51 has a plurality of first top metal pads 51T and a plurality of first bottom metal pads 51B. The package substrate has a second redistribution layer RDL2 which is configured on a bottom side of the first redistribution layer RDL1.

The RDL2 is built according to a second design rule and has a second redistribution circuitry 52 embedded in a second dielectric layer 52D; the second redistribution circuitry 52 has a plurality of second top metal pads 52T and a plurality of second bottom metal pads 52B; each second top metal pad 52T is electrically coupled to a corresponding first bottom metal pad 51B; the first redistribution circuitry 51 fans out downwards so that a density of the first bottom metal pads 51B is lower than a density of the first top metal pads 51T; the second redistribution circuitry 52 fans out downwards so that a density of the second bottom metal pads 52B is lower than a density of the second top metal pads 52T. The second design rule has a lower circuitry density than the first design rule has. A plurality of top openings 521 are configured on a top side of the first dielectric layer 51D; each top opening 521 exposes a top surface of a corresponding first top metal pad 51T; a molding compound 55 wraps four lateral sides and a bottom side of, at least, the second dielectric layer 52D; and a plurality of bottom openings 551 are formed on a bottom side of the molding compound 55; each opening 551 exposes a bottom side of a corresponding second bottom metal pad 52B.

FIG. 6B shows a chip package using the package substrate of FIG. 6A.

FIG. 6B shows at least one chip 56 is exemplarily shown to be electrically coupled to the first top metal pads 51T. A plurality of solder balls 57 are configured on a bottom side of the second redistribution circuitry 52, each solder ball 57 is configured on a bottom side of a corresponding second metal pad 52B.

FIGS. 7A~7B Show a Sixth Embodiment According to the Present Invention.

FIG. 7A shows a package substrate according to the present invention. FIG. 7A shows a package substrate which has a first redistribution layer RDL1. The RDL1 is built according to a first design rule; the RDL1 has a first redistribution circuitry 51 embedded in a first dielectric layer 5D; the first redistribution circuitry 51 has a plurality of first top metal pads 51T and a plurality of first bottom metal pads 51B. The package substrate also has a second redistribution layer RDL2 which is configured on a bottom side of the first redistribution layer RDL1; the RDL2 is built according to a second design rule; the RDL2 has a second redistribution circuitry 52 embedded in a second dielectric layer 52D; the second redistribution circuitry 52 has a plurality of second top metal pads 52T and a plurality of second bottom metal pads 52B; each second top metal pad 52T is electrically coupled to a corresponding first bottom metal pad 51B. The first redistribution circuitry 51 fans out downwards so that a density of the first bottom metal pads 51B is lower than a density of the first top metal pads 51T; the second redistribution circuitry 52 fans out downwards so that a density of the second bottom metal pads 52B is lower than a density of the second top metal pads 52T. The second design rule has a lower circuitry density than the first design rule has. A plurality of metal pillars 53 are formed on a bottom side of the second redistribution circuitry 52, each metal pillar 53 is configured on a bottom side of a corresponding bottom metal pad 52B; a plurality of top openings 521 are configured on a top side of the first dielectric layer 51D; each top opening 521 exposes a top surface of a corresponding first top metal pad 51T; a molding compound 55 wraps four lateral sides and a bottom side of, at least, the second dielectric layer 52D; and a plurality of bottom openings 551 are formed on a bottom side of the molding compound 55; each opening 551 exposes a bottom side of a corresponding metal pillar 53.

FIG. 7B shows a chip package using the package substrate of FIG. 7A.

FIG. 7B shows at least one chip 56 is exemplarily shown to be electrically coupled to the first top metal pads 51T; a plurality of solder balls 57 are configured on a bottom side of the second redistribution circuitry 52, each solder ball 57 is configured on a bottom side of a corresponding metal pillar 53.

Figure 8A:
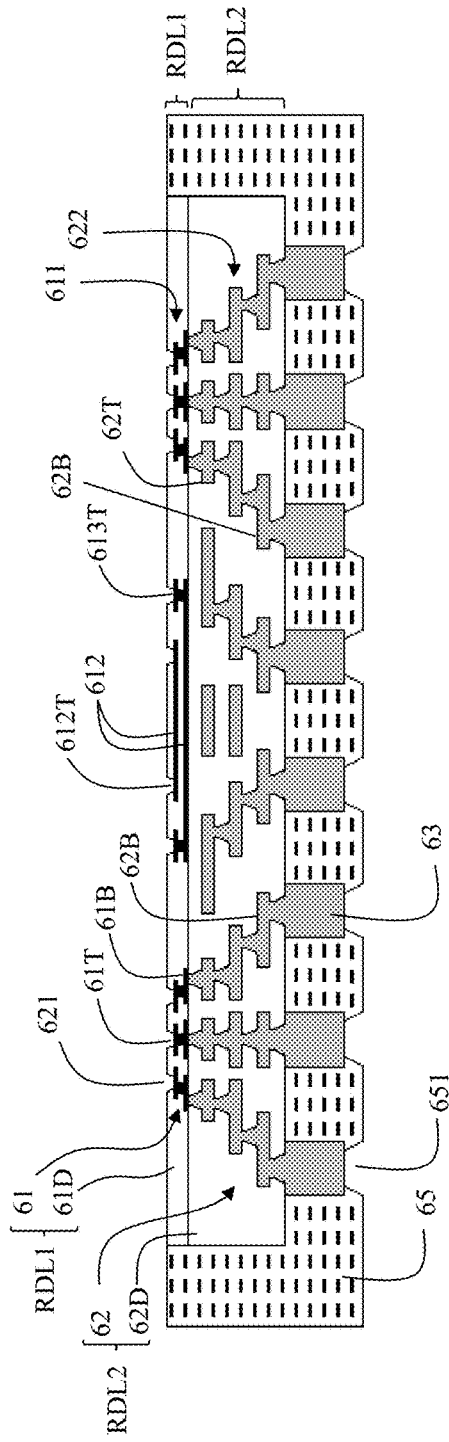
FIGS. 8A~8B show a seven embodiment according to the present invention.
Figure 8B:
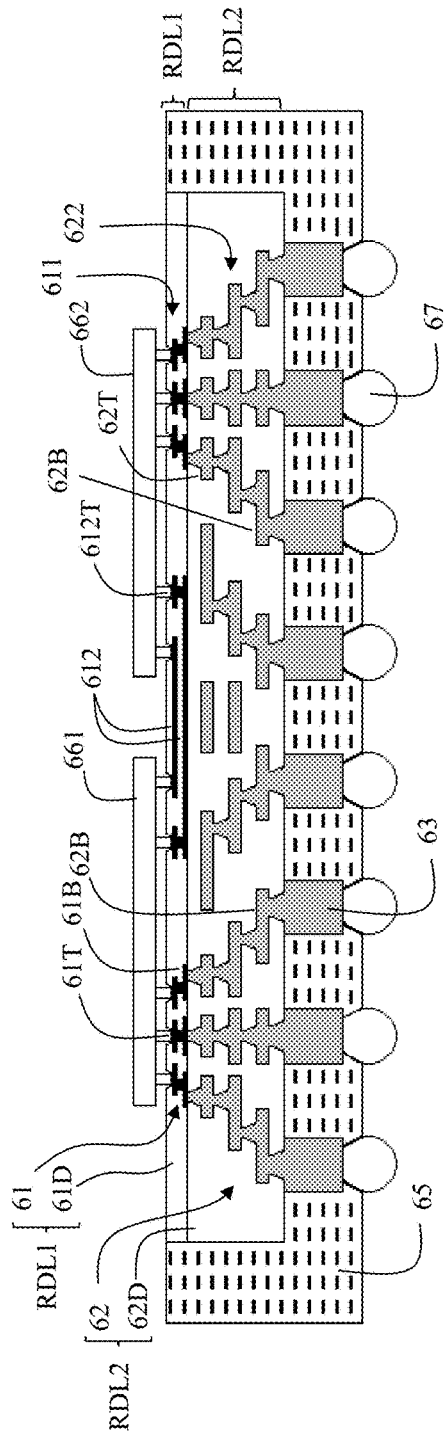

FIGS. 8A~8B Show a Seven Embodiment According to the Present Invention.

FIG. 8A shows a package substrate according to the present invention. FIG. 8A shows a package substrate which has a first redistribution layer RDL1, the RDL1 is built according to a first design rule; the RDL1 has a first redistribution circuitry 61, 611 embedded in a first dielectric layer 61D; the first redistribution circuitry 61, 611 has a plurality of first top metal pads 61T and a plurality of first bottom metal pads 61B.

The package substrate also has a second redistribution layer RDL2 which is built according to a second design rule. The RDL2 is configured on a bottom side of the first redistribution layer RDL1. The RDL2 has a second redistribution circuitry 62, 622 embedded in a second dielectric layer 62D; the second redistribution circuitry 62, 622 has a plurality of second top metal pads 62T and a plurality of second bottom metal pads 62B. The second design rule has a lower circuitry density than the first design rule has. The first redistribution circuitry 61, 611 further comprises: a first left redistribution circuitry 61, embedded in the first dielectric layer 61D, having a plurality of first left top metal pads 61T and a plurality of first left bottom metal pads 61B; a first right redistribution circuitry 611, embedded in the first dielectric layer 61D, having a plurality of first right top metal pads and a plurality of first right bottom metal pads.

The second redistribution circuitry 62, 622 further comprises: a second left redistribution circuitry 62, embedded in a second dielectric layer 62D, has a plurality of second left top metal pads 62T and a plurality of second left bottom metal pads 62B; a second right redistribution circuitry 622, embedded in the second dielectric layer 62D, having a plurality of second right top metal pads 62T and a plurality of second right bottom metal pads 62B; each second left top metal pad 62T is electrically coupled to a corresponding first left bottom metal pad 61B; each second right top metal pad 62T is electrically coupled to a corresponding first right bottom metal pad 61B. The first left redistribution circuitry 61 fans out downwards so that a density of the first left bottom metal pads 61B is lower than a density of the first left top metal pads 61T. The first right redistribution circuitry 611 fans out downwards so that a density of the first right bottom metal pads is lower than a density of the first right top metal pads; the second left redistribution circuitry 62 fans out downwards so that a density of the second left bottom metal pads 62B is lower than a density of the second left top metal pads 62T; the second right redistribution circuitry 622 fans out downwards so that a density of the second right bottom metal pads is lower than a density of the second right top metal pads. A plurality of top openings 621 configured on a top side of the first dielectric layer 61D; each top opening 621 exposes a top surface of a corresponding first top metal pad 61T; a plurality of metal pillars 63 are formed on a bottom side of the second redistribution circuitry 62, each metal pillar 63 is configured on a bottom side of a corresponding second bottom metal pad 62B; and a molding compound 65 wraps four lateral sides and bottom side of, at least, the second dielectric layer 62D; the molding compound 65 also wraps the plurality of metal pillars 63; and a plurality of bottom openings 651 are formed on a bottom side of the molding compound 65; each opening 651 exposes a bottom side of a corresponding metal pillar 63. A lateral communication circuitry 612, built according to the first design rule, is configured between the first left redistribution circuitry 61 and the first right redistribution circuitry 611; the lateral communication circuitry 612 has a plurality of left top metal pads 612T and a plurality of right top metal pads 613T exposed on a top side of the first dielectric layer 61D.

FIG. 8B shows a chip package using the package substrate of FIG. 8A.

FIG. 8B shows two chips 661, 662 configured on a top of the first redistribution circuitry and on a top of the lateral communication circuitry 612. The chip 661 is exemplarily shown to be electrically coupled to the left top metal pads 612T of the lateral communication circuitry 612; and the right chip 662 is exemplarily shown to be electrically coupled to the right top metal pads 613T of the lateral communication circuitry 612; the left chip 661 and the right chip 662 are able to communicate with each other through the lateral communication circuitry 612. A plurality of solder balls 67 are configured on a bottom side of the second redistribution circuitry 62, each solder ball 67 is configured on a bottom side of a corresponding metal pillar 63.

FIGS. 9A~9B Show an Eighth Embodiment According to the Present Invention.

FIG. 9A is a modified structure of FIG. 8A.

FIG. 9A shows a cavity 68 is formed on a bottom side of the second dielectric layer 62D, and enclosed by the molding compound 65; and a plurality of openings 652 are formed on a bottom side of the second dielectric layer 62D within the cavity 68, each opening 652 exposes a bottom side of a corresponding second metal pads 62B within the cavity 68.

FIG. 9B shows a chip package using the package substrate of FIG. 9A.

FIG. 9B shows chips 681, 682 are exemplarily shown to be electrically coupled to the second bottom metal pads 62B within the cavity 68. A plurality of solder balls 67 are configured on a bottom side of the second redistribution circuitry 62, each solder ball 67 is configured on a bottom side of a corresponding metal pillar 63.

FIGS. 10A~10B Show a Top View of FIGS. 9A~9B.

FIG. 10A shows a top view of FIG. 9A. FIG. 10A shows the molding compound 65 wraps four sides of the first dielectric layer 61D and the lateral communication circuitry 612 is embedded in the first dielectric layer 61D.

FIG. 10B shows a top view of FIG. 9B. FIG. 10B shows the chips 664, 662 configured on the top surface of the first dielectric layer 61D. The embedded lateral communication circuitry 612 communicates between the chip 661 and chip 662.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM 31 redistribution circuitry
31B bottom metal pad
31D dielectric layer
31T top metal pad
321 opening
33 metal pillar
35 molding compound
351 opening
36 chip
37 solder ball
38 cavity
381, 382 chip
41 left redistribution circuitry
411 right redistribution circuitry
412 lateral communication circuitry
412T, 413T top metal pad
41B bottom metal pad
41D dielectric layer
41T top metal pad
421 opening
43 metal pillar
45 molding compound
451 opening
452 opening
461, 462 chip
47 solder ball
48 cavity
481, 482 chip
51 redistribution circuitry
51B bottom metal pad
51D dielectric layer
51T top metal pad
52 redistribution circuitry
521 opening
52B bottom metal pad
52D dielectric layer
52T top metal pad
53 metal pillar
55 molding compound
551 opening
56 chip
57 solder ball
61 redistribution circuitry
611 redistribution circuity
612 lateral communication circuitry
612T top metal pad
613T top metal pad
61B bottom metal pad
61D dielectric layer
61T top metal pad
62 redistribution circuitry
621 opening
622 redistribution circuitry
62B bottom metal pad
62D dielectric layer
62T top metal pad
63 metal pillar
65 molding compound
651 opening
652 opening
66 chip
661, 662 chip
67 solder ball
68 cavity
681, 682 chip

What is claimed is:
1. A package substrate, comprising:
a redistribution layer having
a dielectric layer; and
a redistribution circuitry embedded in the dielectric layer, wherein
the redistribution circuitry has a plurality of top metal pads and a plurality of bottom metal pads, and
the redistribution circuitry fans out downwards so that a density of the plurality of bottom metal pads is lower than a density of the plurality of top metal pads;
a plurality of top openings on a topmost surface of the dielectric layer, wherein each top opening among the plurality of top openings exposes a top surface of a corresponding top metal pad among the plurality of top metal pads;
a molding compound wrapping four lateral sides and a bottom side of the dielectric layer;
a plurality of bottom openings on a bottom side of the molding compound, wherein each bottom opening among the plurality of bottom openings is aligned with a bottom side of a corresponding bottom metal pad among the plurality of bottom metal pads; and
a plurality of solder balls on the bottom side of the molding compound,
wherein
each solder ball among the plurality of solder balls is coupled, via a corresponding bottom opening among the plurality of bottom openings, to the bottom side of the corresponding bottom metal pad,
each of the plurality of solder balls is partially embedded in the molding compound, and
the topmost surface of the dielectric layer is flush with a topmost surface of the molding compound.

2. A package substrate as claimed in claim 1, further comprising:
at least one chip on a top side of the redistribution circuitry, and electrically coupled to the plurality of top metal pads of the redistribution circuitry.

3. A package substrate as claimed in claim 1, further comprising:
a plurality of metal pillars embedded in the molding compound on a bottom side of the redistribution circuitry,
wherein
each metal pillar among the plurality of metal pillars is aligned with and coupled to the bottom side of a corresponding bottom metal pad among the plurality of bottom metal pads, and
each bottom opening among the plurality of bottom openings is aligned with and exposes a bottom side of a corresponding metal pillar among the plurality of metal pillars.

4. A package substrate, comprising:
a redistribution layer having
a dielectric layer; and
a redistribution circuitry embedded in the dielectric layer, wherein
the redistribution circuitry has a plurality of top metal pads and a plurality of bottom metal pads, and
the redistribution circuitry fans out downwards so that a density of the plurality of bottom metal pads is lower than a density of the plurality of top metal pads;
a plurality of top openings on a top side of the dielectric layer, wherein each top opening among the plurality of top openings exposes a top surface of a corresponding top metal pad among the plurality of top metal pads;
a molding compound wrapping four lateral sides and a bottom side of the dielectric layer;
a plurality of bottom openings on a bottom side of the molding compound, wherein each bottom opening among the plurality of bottom openings is aligned with a bottom side of a corresponding bottom metal pad among the plurality of bottom metal pads;
a plurality of metal pillars embedded in the molding compound on a bottom side of the redistribution circuitry; and
a plurality of solder balls on the bottom side of the molding compound,
wherein
each metal pillar among the plurality of metal pillars is aligned with and coupled to the bottom side of a corresponding bottom metal pad among the plurality of bottom metal pads,
each bottom opening among the plurality of bottom openings is aligned with and exposes a bottom side of a corresponding metal pillar among the plurality of metal pillars, and
each solder ball among the plurality of solder balls is partially received in a corresponding bottom opening among the plurality of bottom openings and is coupled to the bottom side of the corresponding metal pillar.

5. A package substrate, comprising:
a redistribution layer having
    a dielectric layer; and
    a left redistribution circuitry and a right redistribution circuitry, wherein
        both said left redistribution circuitry and said right redistribution circuitry are embedded in the dielectric layer,
        the left redistribution circuitry has a plurality of left top metal pads and a plurality left bottom metal pads,
        the left redistribution circuitry fans out downwards so that a density of the plurality of left bottom metal pads is lower that a density of the plurality of left top metal pads,
        the right redistribution circuitry has a plurality of right top metal pads and a plurality of right bottom metal pads,
        the right redistribution circuitry fans out downwards so that a density of the plurality of right bottom metal pads is lower that a density of the plurality of right top metal pads;
a plurality of top openings on a top side of the dielectric layer, wherein each top opening among the plurality of top openings exposes a top surface of a corresponding top metal pad among the plurality of left and right top metal pads;
a molding compound wrapping four lateral sides and a bottom side of the dielectric layer;
a plurality of metal pillars embedded in the molding compound on a bottom side of the redistribution circuitry, wherein
    each metal pillar among the plurality of metal pillars is aligned with and coupled to a bottom side of a corresponding bottom metal pad among the plurality of left and right bottom metal pads;
a plurality of bottom openings on a bottom side of the molding compound, wherein
    each bottom opening among the plurality of bottom openings exposes a bottom side of a corresponding metal pillar among the plurality of metal pillars;
a cavity on the bottom side of the dielectric layer, and enclosed by the molding compound; and
a plurality of openings on the bottom side of the dielectric layer within the cavity,
    wherein each opening among the plurality of openings exposes a bottom side of a corresponding bottom metal pad, among the plurality of left and right bottom metal pads, within the cavity.

6. A package substrate as claimed in claim 5, further comprising:
at least one chip located within the cavity, and electrically coupled to the bottom metal pads within the cavity; and
a plurality of conductors each of which extends upwardly from a top surface of the at least one chip, through a corresponding opening among the plurality of openings on the bottom side of the dielectric layer within the cavity, to be in electrical contact with a bottom side of the corresponding bottom metal pad exposed by said corresponding opening.

7. A package substrate as claimed in claim 6, wherein
the redistribution layer further comprises a lateral communication circuitry embedded in the dielectric layer between the left redistribution circuitry and the right redistribution circuitry, and
the lateral communication circuitry electrically couples the left redistribution circuitry and the right redistribution circuitry, and has a plurality of middle top metal pads exposed on the top side of the dielectric layer.

8. A package substrate as claimed in claim 7, further comprising:
a left chip on a top side the left redistribution circuitry, and electrically coupled to the plurality of left top metal pads of the left redistribution circuitry and at least one middle top metal pad among the plurality of middle top metal pads; and
a right chip on a top side of the right redistribution circuitry, and electrically coupled to the plurality of right top metal pad of the right redistribution circuitry and at least another middle top metal pad among the plurality of middle top metal pads.

9. A package substrate as claimed in claim 8, further comprising:
a plurality of solder balls on the bottom side of the molding compound,
wherein each solder ball among the plurality of solder balls is partially received in a corresponding bottom opening among the plurality of bottom openings and is coupled to the bottom side of the corresponding metal pillar.

10. A package substrate, comprising:
a first redistribution layer configured according to a first design rule, and having
    a first dielectric layer; and
    a first redistribution circuitry embedded in the first dielectric layer, wherein the first redistribution circuitry has a plurality of first top metal pads and a plurality of first bottom metal pads;
a second redistribution layer configured according to a second design rule and arranged, in a thickness direction of the package substrate, on a bottom side of the first redistribution layer, the second redistribution layer having
    a second dielectric layer; and
    a second redistribution circuitry embedded in the second dielectric layer, wherein
        the second redistribution circuitry has a plurality of second top metal pads and a plurality of second bottom metal pads, each second top metal pad among the plurality of second top metals is electrically coupled to a corresponding first bottom metal pad among the plurality of first bottom metals;
the first redistribution circuitry fans out downwards so that a density of the plurality of first bottom metal pads is lower than a density of the plurality of first top metal pads;
the second redistribution circuitry fans out downwards so that a density of the plurality of second bottom metal pads is lower than a density of the plurality of second top metal pads, and
the second design rule has a lower circuitry density than the first design rule;
a plurality of top openings on a top side of the first dielectric layer, wherein each top opening among the plurality of top openings exposes a top surface of a corresponding first top metal pad among the plurality of first top metal pads;
a molding compound wrapping and in contact with four lateral sides of the first dielectric layer, the molding compound also wrapping and in contact with four lateral sides and a bottom side of the second dielectric layer; and
a plurality of bottom openings on a bottom side of the molding compound, wherein each bottom opening among the plurality of bottom openings is aligned with a bottom side of a corresponding second bottom metal pad among the plurality of second bottom metal pads,
wherein, in a cross section taken in the thickness direction of the package substrate, a dimension of the first dielectric layer between two opposite lateral sides among the four lateral sides of the first dielectric layer is equal to a dimension of the second dielectric layer between two opposite lateral sides among the four lateral sides of the second dielectric layer.

11. A package substrate as claimed in claim 10, further comprising:
at least one chip on a top side of the first redistribution layer and electrically coupled to the plurality of first top metal pads.

12. A package substrate as claimed in claim 11, further comprising:
a plurality of solder balls on the bottom side of the molding compound,
wherein each solder ball among the plurality of solder balls is coupled, via a corresponding bottom opening among the plurality of bottom openings, to the bottom side of the corresponding second metal pad.

13. A package substrate as claimed in claim 10, further comprising:
a plurality of metal pillars embedded in the molding compound on a bottom side of the second redistribution circuitry,
wherein
each metal pillar among the plurality of metal pillars is aligned with and coupled to the a bottom side of a corresponding second bottom metal pad among the plurality of second bottom metal pads, and
each bottom opening among the plurality of bottom openings is aligned with and exposes a bottom side of a corresponding metal pillar among the plurality of metal pillars.

14. A package substrate as claimed in claim 13, further comprising:
a plurality of solder balls on the bottom side of the molding compound,
wherein each solder ball among the plurality of solder balls is partially received in a corresponding bottom opening among the plurality of bottom openings and is coupled to the bottom side of the corresponding metal pillar.

15. A package substrate as claimed in claim 10, wherein the first redistribution circuitry comprises:
a first left redistribution circuitry embedded in the first dielectric layer, and having a plurality of first left top metal pads and a plurality of first left bottom metal pads; and
a first right redistribution circuitry embedded in the first dielectric layer, and having a plurality of first right top metal pads and a plurality of first right bottom metal pads,
the plurality of first top metal pads includes the plurality of first left top metal pads and the plurality of first right top metal pads,
the plurality of first bottom metal pads includes the plurality of first left bottom metal pads and the plurality of first right bottom metal pads,
the second redistribution circuitry comprises:
a second left redistribution circuitry embedded in the second dielectric layer, and having a plurality of second left top metal pads and a plurality of second left bottom metal pads; and
a second right redistribution circuitry embedded in the second dielectric layer, and having a plurality of second right top metal pads and a plurality of second right bottom metal pads,
the plurality of second top metal pads includes the plurality of second left top metal pads and the plurality of second right top metal pads,
the plurality of second bottom metal pads includes the plurality of second left bottom metal pads and the plurality of second right bottom metal pads,
each second left top metal pad among the plurality of second left top metal pads is electrically coupled to a corresponding first left bottom metal pad among the plurality of first left bottom metal pads,
each second right top metal pad among the plurality of second right top metal pads is electrically coupled to a corresponding first right bottom metal pad among the plurality of first right bottom metal pads,
the first left redistribution circuitry fans out downwards so that a density of the plurality of first left bottom metal pads is lower than a density of the plurality of first left top metal pads,
the first right redistribution circuitry fans out downwards so that a density of the plurality of first right bottom metal pads is lower than a density of the plurality of first right top metal pads,
the second left redistribution circuitry fans out downwards so that a density of the plurality of second left bottom metal pads is lower than a density of the plurality of second left top metal pads,
the second right redistribution circuitry fans out downwards so that a density of the plurality of second right bottom metal pads is lower than a density of the plurality of second right top metal pads,
each top opening among the plurality of top openings exposes the top surface of the corresponding first top metal pad among the plurality of first left and right top metal pads, and the package substrate further comprises a plurality of metal pillars embedded in the molding compound on a bottom side of the second redistribution circuitry, wherein
- each metal pillar among the plurality of metal pillars is aligned with and coupled to a bottom side of a corresponding second bottom metal pad among the plurality of second left and right bottom metal pads, and
- each bottom opening among the plurality of bottom openings exposes a bottom side of a corresponding metal pillar among the plurality of metal pillars.

16. A package substrate as claimed in claim 15, wherein
the first redistribution layer further comprises a lateral communication circuitry configured according to the first design rule,
the lateral communication circuitry is embedded in the first dielectric layer between the first left redistribution circuitry and the first right redistribution circuitry, and
the lateral communication circuitry electrically couples the first left redistribution circuitry and the first right redistribution circuitry, and has a plurality of middle top metal pads exposed on the top side of the first dielectric layer.

17. A package substrate as claimed in claim 16, further comprising:
a left chip on a top side the first left redistribution circuitry, and electrically coupled to the plurality of first left top metal pads of the first left redistribution circuitry and at least one middle top metal pad among the plurality of middle top metal pads of the lateral communication circuitry; and
a right chip on a top side the first right redistribution circuitry, and electrically coupled to the plurality of first right top metal pads of the first right redistribution circuitry and at least another middle top metal pad among the plurality of middle top metal pads of the lateral communication circuitry, so that the left chip and the right chip are configured to communicate with each other through the lateral communication circuitry.

18. A package substrate as claimed in claim 15, further comprising:
a cavity on a bottom side of the second dielectric layer, and enclosed by the molding compound;
a plurality of openings on the bottom side of the second dielectric layer within the cavity,
wherein each opening among the plurality of openings exposes a bottom side of a corresponding bottom metal pad, among the plurality of second left and right bottom metal pads, within the cavity;
at least one chip located within the cavity, and electrically coupled to the bottom metal pads within the cavity; and
a plurality of conductors each of which extends upwardly from a top surface of the at least one chip, through a corresponding opening among the plurality of openings on the bottom side of the dielectric layer within the cavity, to be in electrical contact with a bottom side of the corresponding bottom metal pad exposed by said corresponding opening.

19. A package substrate as claimed in claim 10, wherein a topmost surface of the first dielectric layer is flush with a topmost surface of the molding compound.

* * * * *